(12) United States Patent
Song et al.

(10) Patent No.: US 7,678,666 B2
(45) Date of Patent: Mar. 16, 2010

(54) CRYSTALLIZATION METHOD OF AMORPHOUS SILICON FOR FORMING LARGE GRAIN WITH SINGLE PULSE LASER

(75) Inventors: Ki Bong Song, Daejeon (KR); Jun Ho Kim, Incheon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 740 days.

(21) Appl. No.: 11/430,713

(22) Filed: May 9, 2006

(65) Prior Publication Data

US 2007/0026635 A1    Feb. 1, 2007

(30) Foreign Application Priority Data

Jul. 26, 2005   (KR) ................... 10-2005-0067822
Nov. 15, 2005   (KR) ................... 10-2005-0108943

(51) Int. Cl.
*H01L 21/76* (2006.01)
(52) U.S. Cl. .................. 438/437; 257/E21.134
(58) Field of Classification Search .......... 438/437; 257/E21.134
See application file for complete search history.

(56) References Cited

FOREIGN PATENT DOCUMENTS

| JP | 07106246 | 4/1995 |
|---|---|---|
| KR | 10-20040034776 | 4/2004 |
| KR | 1020040032401 | 4/2004 |

OTHER PUBLICATIONS

'Enlargement of "location controlled" Si grains by dual-beam excimer-laser with bump structures' Burtsev et al., Applied Surface Science 154-155 (2000) 152-158.
'Location Control of Large Grain Following Excimer-Laser Melting of Si Thin-Films' Ishihara et al., Jpn. J. Appl. Phys. vol. 37, 1998, pp. 1071-1075.
'A Novel Double-Pulse Excimer-Laser Crystallization Method of Silicon Thin-Films' Ishihara et al., Jpn. J. Appl. Phys., vol. 34, 1995, pp. 3976-3981.
'Embedded Amorphous Silicon as an Increasing Seeds for Giant Polycrystalline Silicon Grains' The 12$^{th}$ Conference on Optoelectronics and Optical Communications' vol. 12, No. 1, pp. 97-98.

*Primary Examiner*—Matthew Smith
*Assistant Examiner*—Walter H Swanson
(74) *Attorney, Agent, or Firm*—Ladas & Parry LLP

(57) ABSTRACT

A layer structure comprising substrate, a metal layer, a first amorphous silicon layer, an insulating layer, and a second amorphous silicon layer, and a method of crystallizing the second amorphous silicon layer by irradiating single pulse laser to the layer structure are provided. The method provides an effect of forming large grain of amorphous silicon as good as using dual pulse laser or higher just by using single pulse laser without additional optical system. A semiconductor device employing the layer structure maximizes an electron mobility.

11 Claims, 4 Drawing Sheets

CRYSTALLIZATION METHOD OF AMORPHOUS SILICON FOR FORMING LARGE GRAIN WITH SINGLE PULSE LASER

CROSS-REFERENCE TO RELATED PATENT APPLICATION

This application claims the benefit of Korean Patent Application Nos. 10-2005-0067822, filed on Jul. 26, 2005 and 10-2005-0108943, filed on Nov. 15, 2005, in the Korean Intellectual Property Office, the disclosures of which are incorporated herein in their entirety by reference.

BACKGROUND OF THE INVENTION

1. Field of the Invention

The present invention relates to a method of crystallizing amorphous silicon for forming large grain.

2. Description of the Related Art

Development of a recent telecommunication technology accelerates an information-intensive society of the future, and thus, takes an attention for personal information security. An existing security system such as secret number, key, or card for the personal information security as above has disadvantages of easy leakage to others or losing. Hence, in order to protect information more efficiently, personal identification methods using various physiological characteristics are applied.

Among the various physiological characteristics, one widely-used physiological characteristics is a fingerprint. Further, the identification method may be classified into an optical method, a semiconductor method and the like depending on its using tool. In recent years, the methods are now developed to fabricate thin flat-type systems by employing a new technology in a trend of development of telecommunication devices which become small-sized, low-priced, and modularized.

A thin film transistor (TFT) having a thin film structure as above is used as an essential technology for a fingerprint sensor and the like. Generally, the TFT forms its channel as a path for electrons by forming an amorphous silicon layer and crystallizing the silicon layer. In order to fabricate a device having a high operation speed by increasing a mobility of electrons, efforts of enlarging a size of grain in the crystallization of the amorphous silicon layer have been made.

Methods of delaying a crystallization speed to form large grain have been proposed. The crystallization speed is a ratio of a melting duration time to a melting depth, and if a melting duration time is relatively long compared to a predetermined melting depth, the crystallization speed is delayed so as to provide larger grain. Normally, if a crystallization speed is 1 m/s or lower when a melting duration time is 100 ns for a melting depth of 50 through 100 nm, it is known that a possibility of forming large grain is further increased.

A typical method of forming an amorphous silicon thin film to a polycrystal silicon thin film proposed to form large grain is to use an excimer pulse laser (308 nm). Currently, as a method of forming large grain using an excimer laser, there is a method of employing dual pulse laser using single pulse laser from a high laser pulse energy of an optical system. This provides large grain having a size of 5 μm at maximum. The method needs an expensive excimer laser, and a structure of its related optical system is complicated.

For example, the method discloses enlarging silicon grain further in size at a surface portion of the silicon grain than that of a normal silicon grain by delaying a crystallization speed using dual pulse laser. The method provides crystallizing silicon in a stack structure including amorphous silicon/oxide layer/metal using a dual excimer pulse laser. Silicon grain having a size of 5 μm can be formed from a bump structure by the method so as to form large silicon at a specific position (see A. Burtsev, Enlargement of location controlled Si grains by dual beam excimer laser with bump structures, Applied Surface Science). Referring to FIG. 1, amorphous silicon is crystallized by a high temperature process using the method as above so as to form large grain.

However, the method has a problem that high-priced optical systems are inevitably necessary to form double pulse laser. Further, the method has problems that used metal cannot be endurable at a high temperature and is broken during the crystallization, and one process must be selected initially depending on a top gate-type thin film transistor and a bottom gate-type thin film transistor.

Therefore, another method has been proposed to form large grain in order to solve the problems. The method provides large grain using a structure replacing a metal thin film, which is suitable to double pulse excimer laser, that is, is endurable to a high temperature. According to the method, silicon large grain having a size of 5 μm can be formed (see Ryoichi ISHIHARA, Location control of large grain following excimer laser melting of Si thin films, Japanese Journal of Applied Science). However, the method cannot solve the problem of increasing production costs due to a high-priced optical system, which is necessary to use dual pulse laser.

As another example, there is disclosed a method of enlarging a size of silicon grain at a specific surface portion of the silicon grain further than that of a typical case by examining crystallization of the silicon grain in accordance with respective pulse widths of dual pulse laser beams and time intervals between respective pulses. However, the method just provides grain having a size of 0.8 μm (see Ryoichi ISHIHARA, A Novel double pulse excimer laser crystallization method of silicon thin films, Japanese Journal of Applied Physics).

SUMMARY OF THE INVENTION

The present invention provides a crystallization method of amorphous silicon for forming large grain economically in order to increase an electron mobility.

The present invention also provides a layer structure employed for the crystallization method of amorphous silicon for forming large grain economically.

According to an aspect of the present invention, there is provided a method of crystallizing amorphous silicon comprising forming a layer structure comprising a substrate, a metal layer, a first amorphous silicon layer, an insulating layer, and a second amorphous silicon layer, and irradiating laser light to the layer structure so as to crystallize the second amorphous silicon layer. Therefore, a size of grain can be maximized by crystallizing the second amorphous silicon. Further, the method of crystallizing the second amorphous silicon provides an effect of forming large grain as good as using dual pulse laser or higher just by using single pulse laser without additional optical system.

According to another aspect of the present invention, there is provided a layer structure for crystallizing amorphous silicon. The layer structure comprises a metal layer formed on a substrate, a first amorphous silicon layer formed on the metal layer, an insulating layer formed on the first amorphous silicon layer, and a second amorphous silicon layer formed on the insulating layer. Therefore, a crystallization speed of the first amorphous silicon can be slowed by the second amorphous silicon layer, thereby forming large grain effectively.

The metal layer may use tungsten alloy, and the insulating layer may use a silicon oxide layer. The metal layer, the first amorphous silicon layer, the insulating layer, and the second amorphous silicon layer of the layer structure may be formed to have thicknesses of 4800 through 7200 Å, 1600 through 2400 Å, 1200 through 1800 Å, and 800 through 1200 Å respectively.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

Figure 1:
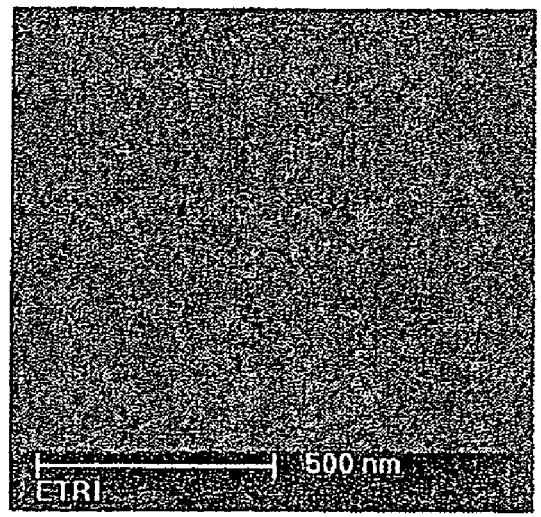
FIG. 1 is a photograph illustrating a large grain of amorphous silicon formed by a conventional high temperature process.
Figure 2:
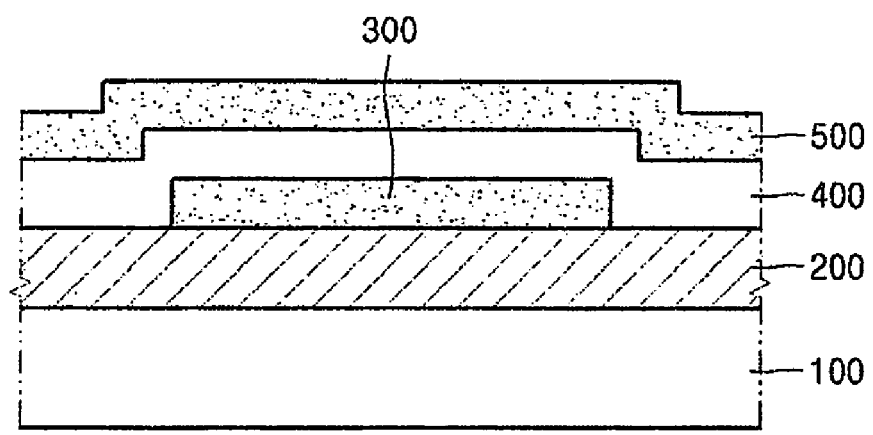
FIG. 2 is a view illustrating a layer structure for crystallizing amorphous silicon according to an embodiment of the present invention.

FIG. 2 is a view illustrating a layer structure for crystallizing amorphous silicon according to an embodiment of the present invention.

Referring to FIG. 2, a metal layer 200, a first amorphous silicon layer 300, a silicon oxide layer 400, and a second amorphous silicon layer 500 are formed on a substrate 100. The substrate 100 is preferably a light-transmissible glass substrate. The metal layer 200 preferably uses a tungsten alloy, and the metal layer 200 helps the second amorphous silicon- layer 500 to a crystal structure when a heat energy at a temperature of a melting point of the second amorphous silicon layer 500 or higher is applied to the second amorphous silicon layer 500. The first amorphous silicon layer 300 partially emits the absorbed heat energy again when the heat energy applied to the second amorphous silicon layer 500 is diffused. Hence, a crystallization speed of the second amorphous silicon layer 500 may be slowed by the emitted heat energy. When a heat energy is applied to the second amorphous silicon layer 500, the first amorphous silicon layer 300 functions as a heat seed for slowing a crystallization speed of the second amorphous silicon layer 500. The first amorphous silicon layer 300 may be formed to be surrounded by an insulating layer, and the silicon oxide layer 400 at its upper surface and side surface. This is intended to effectively emit heat from the first amorphous silicon layer 300 in order to slow a crystallization speed of the second amorphous silicon layer 500. The silicon oxide layer 400 may be used as an insulating layer when the structure is employed to a thin film transistor. The second amorphous silicon layer 500 is crystallized to a polysilicon by the applied heat energy so that a channel of a thin film transistor is formed.

The respective layers of the structure may be formed using a typical deposition process. For thicknesses of the respective layers of the structure, an analysis result of heat structure by a finite element method shows the optimized crystallized structure of the first amorphous silicon when the metal layer 200, the first amorphous silicon layer 300, the silicon oxide layer 400, and the second amorphous silicon layer 500 are respectively 1000 Å, 1500 Å, 2000 Å, and 6000 Å. Since the layer structure may be used for a fingerprint sensor or the like, the layer structure must be structured endurably against a pressure per unit surface area by a finger not to be broken if the layer structure is employed for a fingerprint sensor applied with a force per unit surface area. Therefore, the thin layers are preferably formed without any voids.

Then, a method of crystallizing amorphous silicon using the layer structure of FIG. 2 will be explained.

Laser light is irradiated to the layer structure of FIG. 2 including the substrate 100, the metal layer 200, the first amorphous silicon layer 300, the silicon oxide layer 400, and the second amorphous silicon layer 500 so as to crystallize the second amorphous silicon layer 500. The laser may use a single-pulse laser. This is because the first amorphous silicon layer 300 functions as a heat seed to slow a crystallization speed of the second amorphous silicon layer 500. Therefore, large grain can be formed just using a single-pulse laser without an additional optical system by the crystallization method, thereby providing the same result as that of using a dual pulse laser. In the single-pulse laser, a laser light having about 50 ns-pulse width is vertically irradiated, and a temperature of its energy is preferably determined in a range of melting the second amorphous silicon layer 500 but not vaporizing the second amorphous silicon layer 500.

Figure 3:
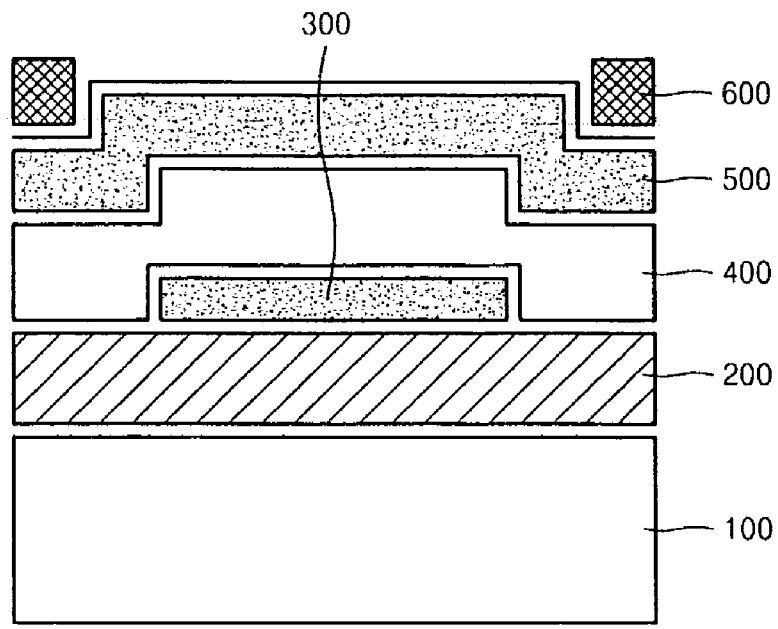
FIG. 3 is a view illustrating a layer structure employed to a bottom gate-type thin film transistor according to an embodiment of the present invention.
Figure 4:
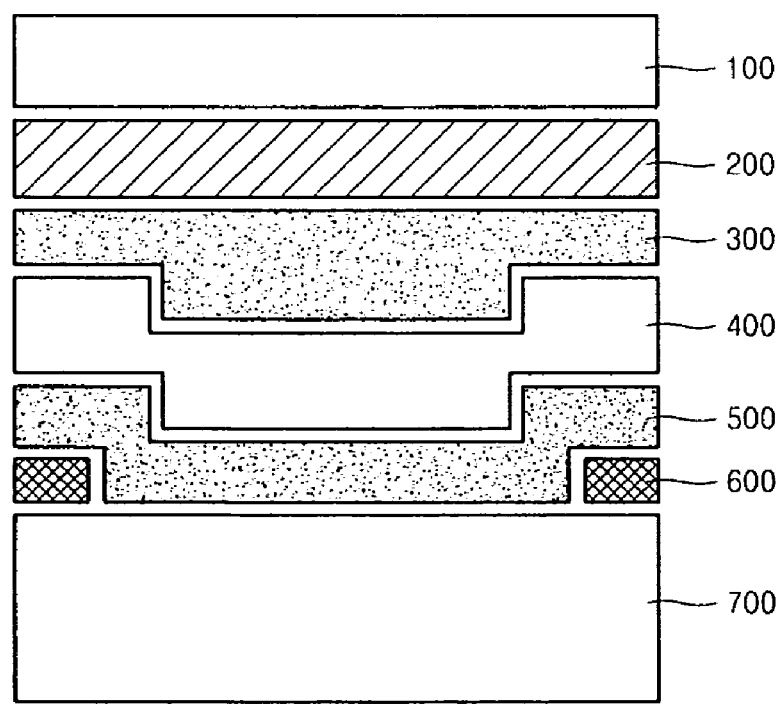
FIG. 4 is a view illustrating a layer structure employed to a top gate-type thin film transistor according to an embodiment of the present invention.

FIG. 3 is a view illustrating a layer structure according to an embodiment of the present invention to be employed for a bottom gate-type thin film transistor. FIG. 4 is a view illustrating a layer structure according to an embodiment of the present invention to be employed for a top gate-type thin film transistor.

Referring to FIG. 3, ions are implanted into the second amorphous silicon layer 500 in the layer structure of FIG. 2, thereby forming source/drain regions, and forming a channel through which electrons are moved between the source/drain regions. A contact 600 electrically connecting the source/drain regions and upper elements is formed. FIG. 4 illustrates the layer structure of FIG. 2 by turning the layer structure upside down, and another glass substrate 700 is further formed on the second amorphous silicon layer 500 disposed below in FIG. 4.

Therefore, the layer structures of FIGS. 3 and 4 can be employed to a bottom gate-type thin film transistor and a top gate-type thin film transistor respectively. This is because pulse laser energy can be supplied through the transparent glass substrate in the crystallization process of the amorphous silicon.

Hereinafter, an experiment example for heat analysis of the layer structure according to an embodiment of the present invention including a heat seed layer will be explained.

The layer structure of FIG. 2 fabricated using a typical deposition method is used for an experiment group. For a control group, a layer structure formed by removing the first amorphous silicon layer 300 as a heat seed layer from the layer structure of FIG. 2 is used. Laser light having 50 ns-pulse width is vertically irradiated on the layer structure, and an energy in a range of a temperature melting the second amorphous silicon layer 500 but not vaporizing the second amorphous silicon layer 500 is applied. When the energy is applied to the layer structure, it is assumed that a duration time of the melting temperature for the second amorphous silicon layer 500 is 200 ns or more.

Figure 5A:
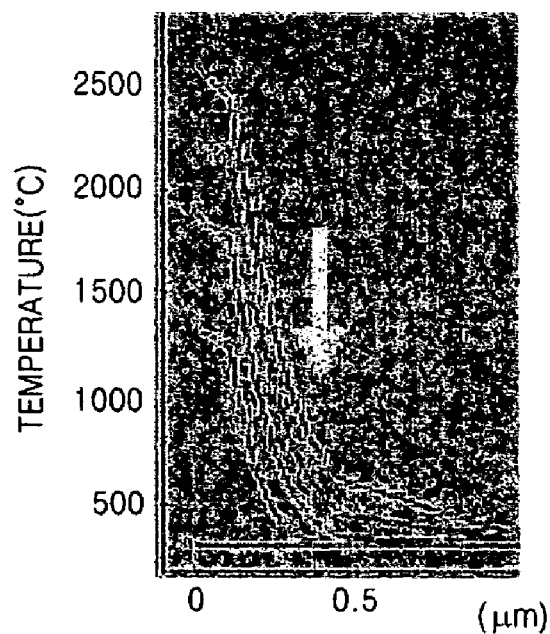
FIGS. 5A and 5B are graphs illustrating thermal diffusion results of layer structures according to an embodiment of the present invention and a control group for 50 ns.
Figure 5B:
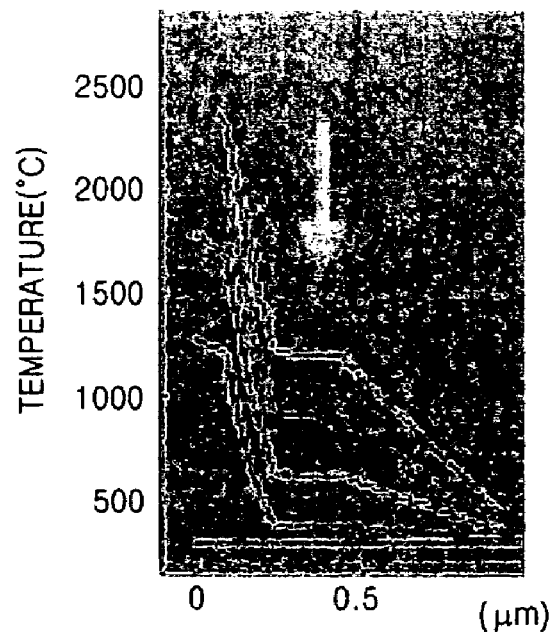
Figure 6A:
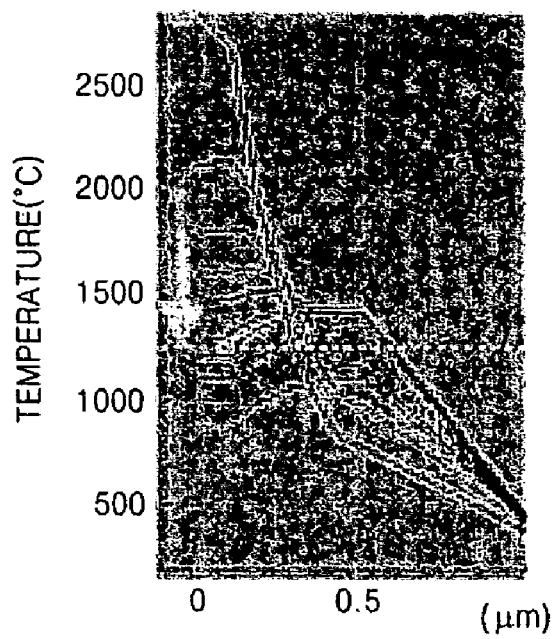
FIGS. 6A and 6B are graphs illustrating thermal diffusion results of layer structures according to an embodiment of the present invention and a control group for 200 ns.
Figure 6B:
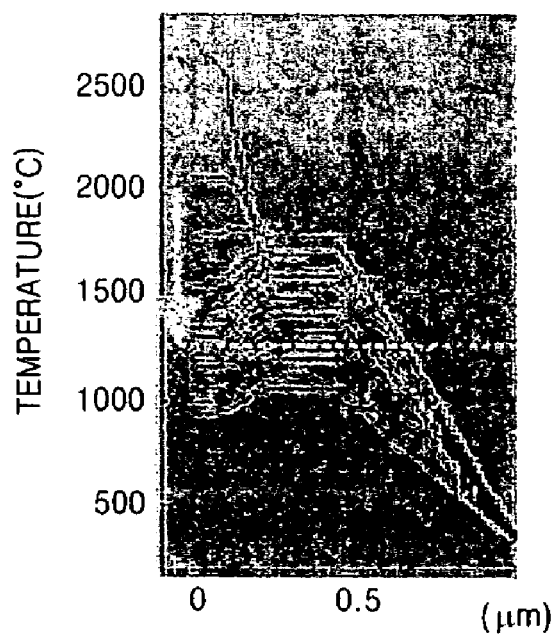

FIGS. 5A, 5B, 6A and 6B are graphs illustrating thermal diffusion results of the layer structure according to an embodiment of the present invention and the layer structure of the control group respectively. FIGS. 5A and 5B illustrate the case of 50 ns and FIGS. 6A and 6B illustrate the case of 200 ns, and FIG. 5A illustrates the result of the control group and FIG. 5B illustrates the result of the experiment group.

Referring to FIGS. 5A and 5B, it is shown that a temperature of the graph in FIG. 5B is higher in whole than that of the graph in FIG. 5A. From the result, it is acknowledged that the crystallization of the second amorphous silicon layer 500 is significantly delayed by the presence of the first amorphous silicon layer 300.

Like the results of FIGS. 5A and 5B, it is also shown that a temperature of the graph in FIG. 6B is higher in whole than that of the graph in FIG. 6A.

A crystallization speed depends on a melting duration time, and the melting duration time is delayed to about 100 ns or more by the first amorphous silicon layer 300. Hence, it is acknowledged that the crystallization speed may be slowed down to almost 0.7 m/s or less considering an initial irradiation time. Therefore, large grain can be formed easily using a single-pulse laser by employing the layer structure including the first amorphous silicon layer 300 according to an embodiment of the present invention.

The crystallization method of amorphous silicon using the layer structure including the amorphous silicon layer as a heat seed layer according to the present invention slows a crystallization speed of the amorphous silicon, thereby forming large grain.

Further, by using a single-pulse laser without additional optical system, the layer structure of the present invention provides a formation result of large grain equal to or better than the formation result provided by a dual pulse laser. Particularly, the layer structure of the present invention can be employed to a top gate-type thin film transistor and a bottom gate-type thin film transistor both, and thus, may be easily used for various devices such as a fingerprint sensor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of crystallizing amorphous silicon comprising:
    forming a layer structure comprising a substrate, a metal layer, a first amorphous silicon layer, an insulating layer, and a second amorphous silicon layer; and
    irradiating laser light to the layer structure so as to crystallize the second amorphous silicon layer, wherein the first amorphous silicon layer is formed nearer the substrate than the second amorphous silicon layer, and
    wherein the first amorphous silicon layer acts as a heat seed for reducing a crystallization speed of the second amorphous silicon layer.

2. The method of claim 1, wherein the metal layer is a tungsten alloy.

3. The method of claim 1, wherein the insulating layer is a silicon oxide layer.

4. The method of claim 1, wherein the insulating layer is a silicon oxide layer formed to surround an upper surface and a side surface of the first amorphous silicon layer.

5. The method of claim 1, wherein the metal layer, the first amorphous silicon layer, the insulating layer, and the second amorphous silicon layer of the layer structure are formed to have thicknesses in the range of 4800 to 7200 Å, 1600 to 2400 Å, 1200 to 1800 Å, and 800 to 1200 Å respectively.

6. The method of claim 1, wherein the laser is a single-pulse laser.

7. A method of crystallizing amorphous silicon comprising:
    forming a layer structure comprising a substrate, a metal layer, a first amorphous silicon layer, an insulating layer, and a second amorphous silicon layer; and
    irradiating laser light to the layer structure so as to crystallize the second amorphous silicon layer, wherein the laser is a single-pulse laser and is applied to only one surface of the layer structure.

8. The method of claim 7, wherein the metal layer is a tungsten alloy.

9. The method of claim 7, wherein the insulating layer is a silicon oxide layer.

10. The method of claim 7, wherein the insulating layer is a silicon oxide layer formed to surround an upper surface and a side surface of the first amorphous silicon layer.

11. The method of claim 7, wherein the metal layer, the first amorphous silicon layer, the insulating layer, and the second amorphous silicon layer of the layer structure are formed to have thicknesses in the range of 4800 to 7200 Å, 1600 to 2400 Å, 1200 to 1800 Å, and 800 to 1200 Å respectively.

* * * * *